United States Patent
Herner et al.

(10) Patent No.: US 7,144,807 B2
(45) Date of Patent: Dec. 5, 2006

(54) LOW RESISTIVITY TITANIUM SILICIDE ON HEAVILY DOPED SEMICONDUCTOR

(75) Inventors: Scott Brad Herner, Palo Alto, CA (US); Michael A. Vyvoda, Fremont, CA (US)

(73) Assignee: SanDisk 3D LLC, Sunnyvale, CA (US)

( * ) Notice: Subject to any disclaimer, the term of this patent is extended or adjusted under 35 U.S.C. 154(b) by 289 days.

(21) Appl. No.: 10/247,071

(22) Filed: Sep. 18, 2002

(65) Prior Publication Data

US 2003/0030147 A1    Feb. 13, 2003

Related U.S. Application Data

(62) Division of application No. 09/928,975, filed on Aug. 13, 2001.

(51) Int. Cl.
  *H01L 21/44*  (2006.01)
  *H01L 21/4763* (2006.01)
(52) U.S. Cl. .................. 438/655; 438/592; 438/630; 438/647
(58) Field of Classification Search ........... 257/770, 257/764, 754; 438/660, 630, 592, 649, 683, 438/585, 587, 588, 647, 655–657
   See application file for complete search history.

(56) References Cited

U.S. PATENT DOCUMENTS

| | | | | |
|---|---|---|---|---|
| 5,164,333 | A * | 11/1992 | Schwalke et al. | 438/303 |
| 5,731,239 | A * | 3/1998 | Wong et al. | 438/296 |
| 6,034,882 | A * | 3/2000 | Johnson et al. | 365/103 |
| 6,488,776 | B1 * | 12/2002 | Wang | 118/715 |
| 2002/0045342 | A1 * | 4/2002 | Hu et al. | 438/656 |

OTHER PUBLICATIONS

Syd R. Wilson, Clarence J. Tracy, and John L. Freeman, Jr., "Handbook of Multilevel Metallization for Integrated Circuits," Noyes Publ., Westwood, New Jersey, (1993), pp. 44-50.*

T. Nakayama, T. Asamura, M. Kato, M. Murota, M. Matsumoto, Y. Washizu, K. Tomose, K. Kasai, Y. Okayama, K. Hashimoto, K. Ohuchi, K. Hattori, J. Shiozawa, H. Harakawa, F. Matsuoka, and M. Kinugawa, "Excellent Process Control Technology for Highly Manufacturable and High Performance 0.18 um CMOS LSIs, " IEEE Digest Tech. Papers, Symposium on VLSI Technology, (1998), pp. 146-147.*

A. S. Spinelli, A. Pacelli, and A. L. Lacaita, "An Improved Formula for the Determination of the Polysilicon Doping," IEEE Electron Device Letters, vol. 22, No. 6, (Jun. 2001), pp. 281-283.*

(Continued)

*Primary Examiner*—Hung Vu
(74) *Attorney, Agent, or Firm*—Brinks Hofer Gilson & Lione

(57) ABSTRACT

Low resistivity, C54-phase $TiSi_2$ is formed in narrow lines on heavily doped polysilicon by depositing a bi-layer silicon film. A thin, undoped amorphous layer is deposited on top of a heavily doped layer. The thickness of the undoped amorphous Si is about 2.4 times the thickness of the subsequently deposited Ti film. Upon thermal annealing above 750° C., the undoped amorphous Si is consumed by the reaction of Ti+Si to form $TiSi_2$, forming a low-resistivity, C54-phase $TiSi_2$ film on top of heavily doped polysilicon. The annealing temperature required to form C54 phase $TiSi_2$ is reduced by consuming undoped amorphous Si in the reaction of Ti and Si, as compared with heavily doped polysilicon. Narrow lines (<0.3 μm) of low-resistivity, C54-phase $TiSi_2$ films on heavily doped polysilicon are thus achieved.

13 Claims, 3 Drawing Sheets

OTHER PUBLICATIONS

Masaki Tsukude, Takahisa Eimori, and Kazutami Arimoto, "A 256Mb DRAM," Advance Magazine, Mitsubishi Electric (Jun. 1996), vol. 75, pp. 5-8.*

T. Nakayama, T. Asamura, M. Kako, M. Murota, M. Matsumoto, Y. Washizu, K. Tomose, K. Kasai, Y. Okayama, K. Hashimoto, K. Ohuchi, K. Hattori, J. Shiozawa, H. Harakawa, F. Matsuoka, and Kinugawa, "Excellent Process Control Technology for Highly Manufacturable and High Performance 0.18 um CMOS LSIs" IEEE Digest Tech. Papers, Symposium on VLSI Technology, (1998) pp. 146-147.

A.S. Spinelli, A. Pacelli, and A.L. Lacaita, "An Improved Formula for the Determination of the Polysilicon Doping," IEEE Electron Device Letters, vol. 22, No. 6, (Jun. 2001) pp. 281-283.

S.P. Murarka, Silicides for VLSI Applications (Academic, Orlando, 1983).

L. A. Clevenger, R.W. Mann, R. A. Roy, K. L. Saenger, C. Cabral, and J. Piccirillo, J. Appl. Phys. 76, 7874 (1994).

C. A. Sukow and R. J. Nemanich, J. Mat. Res. 9, 1214 (1994).

I. Sakai, H. Abiko, H. Kawaguchi, T. Hirayama, L.E.G. Johansson, and K. Okabe: Symp. VLSI Technol. Dig, 66 (1992).

Syd R. Wilson, Clarence J. Tracy, and John L. Freeman, Jr., "Handbook of Multilevel Metallization for Integrated Circuits," Noyes Publ., Westwood, New Jersey, (1993), pp. 44-50.

* cited by examiner

LOW RESISTIVITY TITANIUM SILICIDE ON HEAVILY DOPED SEMICONDUCTOR

This application is a division of application Ser. No. 09/928,975, filed Aug. 13, 2001.

BACKGROUND

This invention relates to methods for forming narrow lines of low-resistivity, C54-phase $TiSi_2$ on heavily-doped semiconductors.

Titanium silicide ($TiSi_2$) has been a commonly used metallization in silicon integrated circuits (ICs) due its low resistivity, compatibility with common silicon process steps such as etch, minimal contamination, and ability to reduce the native oxide on silicon.[1] However, as feature size shrinks below 0.3 µm, the use of $TiSi_2$ has been decreasing because of an inability to obtain low resistivity $TiSi_2$ on small features. This has been called the "fine line effect."[2] The desire for the continued use of $TiSi_2$ in advanced chip generations has inspired substantial effort to understand and control the fine line effect.

Titanium silicide is typically formed by first sputtering or chemical depositing thin films of Ti on Si. Upon heating, the Ti reacts with the Si to form $TiSi_x$ phases. The high resistivity C49 $TiSi_2$ phase forms when the film is heated to a temperature between 550 and 700° C. The C49 $TiSi_2$ phase is a base-centered, orthorhombic crystal structure with a resistivity of ~40–60 µΩcm. This film then transforms to the low resistivity C54 $TiSi_2$ phase upon heating to a temperature in excess of 750° C. The C54 phase is a face-centered, orthorhombic crystal with a resistivity of ~14–16 µΩcm. Since high-resistivity C49 phase is often unsuitable for Si device performance, conversion of C49 to C54 phase is often important.

Experiments have shown that there is a relatively small density of nucleation sites in the C49 phase film for the C49-to-C54 transformation. As the line width of a structure is decreased, it becomes more difficult to transform the C49 $TiSi_2$ films on top of the narrow lines into C54 phase by thermal annealing due a lack of nuclei. This can result in $TiSi_2$ films in narrow lines that are still in the high-resistivity C49 phase, or a combination of C49 and C54 phases, even after high temperature annealing, with attendant higher resistivity than if the film were completely in the C54 phase. Annealing to temperatures in excess of 850° C. may not induce a complete transformation to C54 phase in narrow lines. Titanium disilicide films annealed at temperatures in excess of 800° C. begin to "thermally groove," a process by which the individual $TiSi_2$ grains in the film start to become spherical in shape. When thermal grooving is severe, the individual grains separate from one another, making the film discontinuous. The resulting film is no longer conductive.[3]

Several factors in addition to narrow line widths influence the C49-to-C54 transformation. Increased annealing temperature is required to induce the C49-to-C54 transformation when: 1) the thickness of the deposited Ti film is decreased; 2) the Si substrate is heavily doped; and 3) the Si substrate is single or polycrystalline, as opposed to amorphous, silicon.[2,4]

REFERENCES

1. S. P. Murarka, Silicides for VLSI Applications (Academic, Orlando, 1983).
2. L. A. Clevenger, R. W. Mann, R. A. Roy, K. L. Saenger, C. Cabral, and J. Piccirillo, *J. Appl. Phys.* 76, 7874 (1994).
3. C. A. Sukow and R. J. Nemanich, *J. Mat. Res.* 9, 1214 (1994).
4. I. Sakai, H. Abiko, H. Kawaguchi, T. Hirayama, L. E. G. Johansson, and K. Okabe: *Symp. VLSI Technol. Dig,* 66 (1992).

SUMMARY

By way of general introduction, the embodiments described below provide the desired narrow conductors (line width less than 0.3 µm) formed of titanium disilicide over heavily doped semiconductor regions. In the preferred method described below, a second semiconductor region that is lightly doped or undoped is formed over a first semiconductor region that is heavily doped. Then a titanium layer is formed over the second semiconductor region. At least the titanium layer is patterned into thin lines having a line width no greater than 0.3 µm, and the thickness t1 of the second semiconductor region is greater than the thickness t2 of the titanium layer by a factor of about 2.3. When this semiconductor structure is annealed at annealing temperatures above 750° C., the titanium reacts with the silicon of the second semiconductor region to form titanium disilicide in the desired, low-resistivity C54 phase.

This and the preceding sections have been provided by way of general introduction, and they are not intended to narrow the scope of the following claims.

DETAILED DESCRIPTION OF THE DRAWINGS

Figure 1:
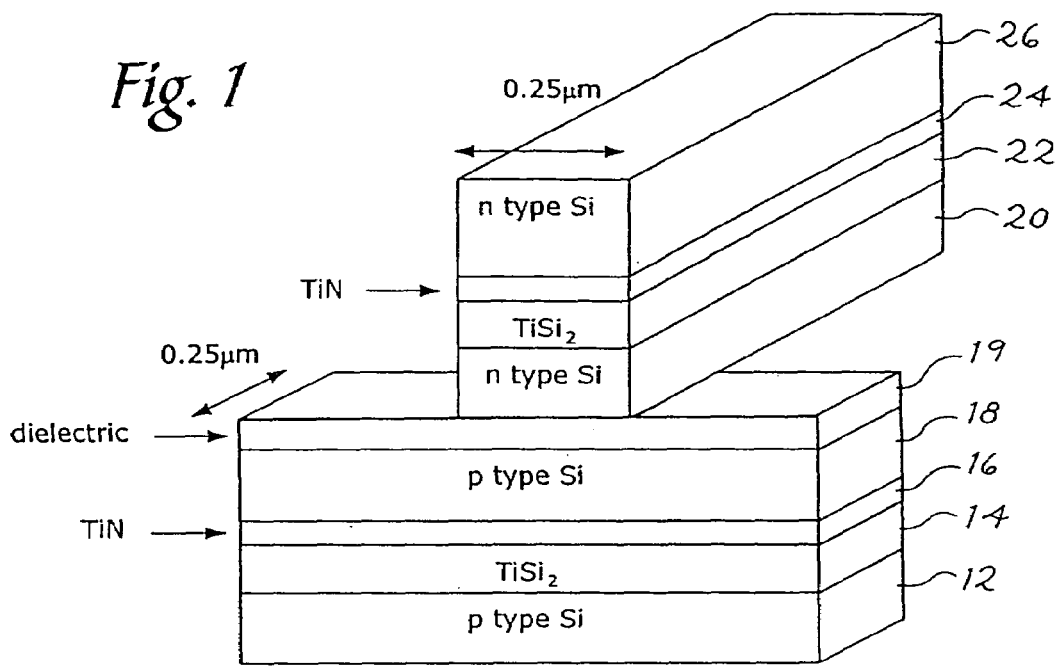
FIG. 1 is a schematic, isometric view showing a semiconductor structure that incorporates a preferred embodiment of this invention.

Turning now to the drawings, FIG. 1 shows a schematic representation of a semiconductor structure 10 that incorporates a preferred embodiment of this invention. The semiconductor structure 10 is a portion of a three-dimensional, field-programmable, write-once memory array of the general type described in co-pending U.S. patent application Ser. No. 09/928,536, filed on the same day as the present application and hereby incorporated by reference in its entirety. The portion of the memory array shown in FIG. 1 includes layers 12, 14, 16 18, and 19 that are patterned with a line width of 0.25 µm. The layer 14 acts as a low-resistivity conductor, and can for example correspond to a word line in a memory array. The layer 19 acts as a dielectric rupture anti-fuse layer, and the layer 18 operates as a diode component. The layers 14, 22 are electrical contacts to the adjacent diode components as well as contacts to the outside world.

Formed immediately above the layer 18 is a set of layers including layers 20, 22, 24, and 26. The layers 20, 22, 24, 26 are also patterned with a line width of 0.25 µm, running in a direction orthogonal to the direction of layers 12, 14, 16, 18. The layer 20 is a second diode component that is doped with an opposite polarity dopant with respect to the layer 18. Thus, the layers 18, 20 form a PN junction diode. Layer 22 forms a low-resistivity conductor, which may correspond to a bit line in one example.

The crossed conductors 14, 22, and the portions of the layers 18, 19, 20 aligned with the intersection of the crossed conductors 14, 22 form a field-programmable, write-once memory cell. When a write current of sufficient voltage or current is passed between the conductors 14, 22 (with a polarity selected to forward bias the diode formed by the layers 18, 20), the dielectric anti-fuse layer formed by the layer 19 is breached or ruptured. This reduces the electrical resistance of the anti-fuse layer 19 at the intersection between the conductors 14, 22, and the result is a programmed cell that provides a high read voltage when a read pulse is applied with forward-bias polarity across the conductors 14, 22. In the absence of a write pulse, the anti-fuse layer 19 remains intact, and the respective memory cells remains unprogrammed.

The remaining layers 12, 26 form part of adjacent, vertically stacked memory cells. The above-referenced U.S. patent application provides a full description of the function and operation of these additional layers, as well as of other types of stacked memory cells that may be substituted for the memory cell of FIG. 1.

Figure 2:
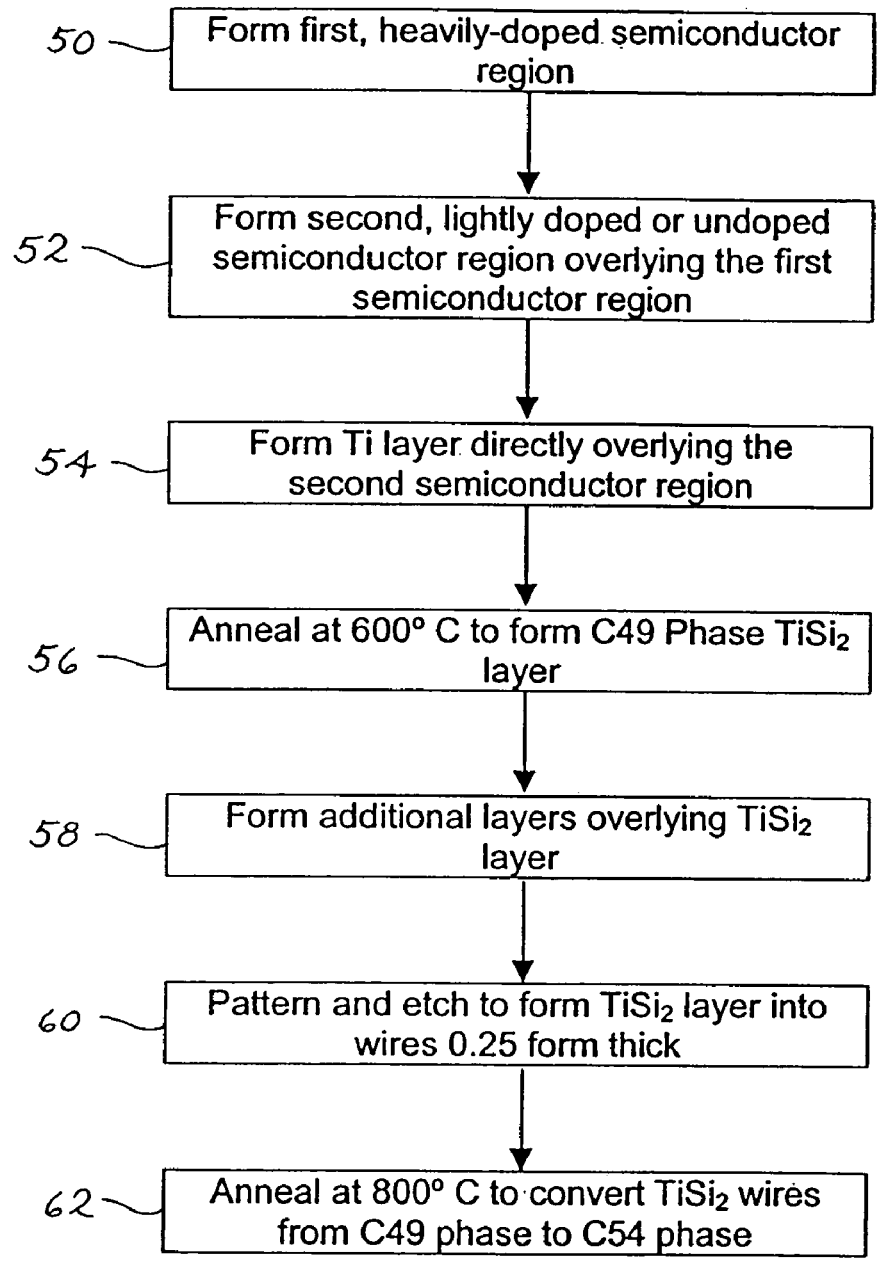
FIG. 2 is a flow chart of a method for fabricating the semiconductor structure of FIG. 1.

As explained above, it is progressively more difficult to form low-resistivity titanium disilicide wires having a line width less than 0.3 μm. due to incomplete conversion of $TiSi_2$ to the desired C54 phase. In order to overcome this problem, the embodiment of FIG. 1 is preferably formed using the method flow charted in FIG. 2. As shown in FIG. 2, a first, heavily doped semiconductor region is formed. This heavily doped semiconductor region corresponds, for example, to the layer 12 of FIG. 1, and it is doped to a concentration in excess of $10^{19}/cm^3$. The first semiconductor region of block 50 (FIG. 2) can be formed of amorphous silicon (e.g., in the case of the n-type doping) or polycrystalline silicon (e.g., in the case of p-type doping). The first semiconductor region can also be formed of polycrystalline silicon as deposited.

In block 52 a second, lightly doped or undoped semiconductor region is formed overlying the first semiconductor region. This second semiconductor region can, for example, correspond to the region 28 of FIG. 3 and can be formed of undoped or lightly doped amorphous silicon. In this context, the term "lightly doped" will be used to refer to semiconductor regions having a dopant concentration less than $1 \times 10^{19}/cm^3$. In this example, the second, lightly doped or undoped semiconductor region 28 corresponds to a capping layer of undoped amorphous silicon having a thickness t1 of 600 Å. Other semiconductor materials can be used for the capping layer, such as polycrystalline silicon and alloys of silicon and germanium (e.g. $Si_{0.8}Ge_{0.2}$).

Returning to FIG. 2, in block 54 a layer comprising titanium is formed directly overlying the second semiconductor region 28. This layer of block 54 can, for example, correspond to a layer 30 of titanium having a thickness of 250 Å. Alloys of titanium can be used for the layer 30, such as titanium alloyed with 1–3% of tantalum and/or molybdenum.

Returning to FIG. 2, in block 56 the partially fabricated semiconductor structure is annealed (e.g. at 600° C. for 60 seconds) to cause the titanium of the layer 30 to react with the silicon of the layer 28 to form C49-phase titanium disilicide. As explained above, C49-phase titanium disilicide has a high resistivity, and is generally unsuitable for use as conductors in integrated circuits.

In block 58 additional layers are formed overlying the titanium disilicide layer of block 56. In block 60 the partially fabricated semiconductor structure is patterned and etched to form the titanium disilicide layer into wires having a line width of 0.25 μm. The acts of blocks 50 through 60 can then be repeated one or more times to form other sets of layers, such as the layers 20 through 26 of FIG. 1. Then the semiconductor structure is annealed in block 62 of FIG. 2 for 60 seconds at 800° C. to convert the titanium disilicide wires from C49 phase to C54 phase. The result is the structure shown in FIG. 4. The titanium of the layer 30 has reacted with the silicon of the layer 28 of FIG. 3 to form the titanium disilicide layer 14 of FIG. 4. A method similar to that of FIG. 2 can be used to form titanium disilicide wires on n-type silicon. Because the first annealing operation of block 56 is conducted at only 600° C. for 60 seconds (RTA #1), dopant diffusion and thermal grooving of the titanium disilicide layer are minimized, when the film stacks are sequentially deposited and reacted using RTA #1. The second, higher temperature anneal (RTA #2) can be done after multiple $TiSi_2$ wires stacked upon one another have been formed, thus minimizing dopant diffusion in the silicon and thermal grooving of the $TiSi_2$ wires.

The sheet resistance of $TiSi_2$ can be predicted from the deposited thickness of titanium and the resistivity of C54 phase $TiSi_2$. Each angstrom of Ti will consume ~2.3 Å of Si to form 2.5 Å of $TiSi_2$.[1] Therefore, 250 Å of Ti will form ~635 Å of $TiSi_2$, consuming ~570 Å of Si. If the 635 Å $TiSi_2$ is C54 phase, it will have a sheet resistance of ~2.2–2.5 Ω/sq. If the $TiSi_2$ is C49 phase, it will have a sheet resistance of ~6.3–9.4 Ω/sq. Films that are a combination of C49 and C54 phases will have sheet resistances between 2.2 and 9.4 Ω/sq.

Multiple wafers were each patterned with many $TiSi_2$ wires, and the sheet resistance (Rs) was measured on the individual 0.25 μm width lines. These measurements showed that the thickness of the undoped or lightly doped layer 28 plays an important role in determining completeness of conversion of the titanium disilicide wires from the C49 phase to the C54 phase.

Figure 3:
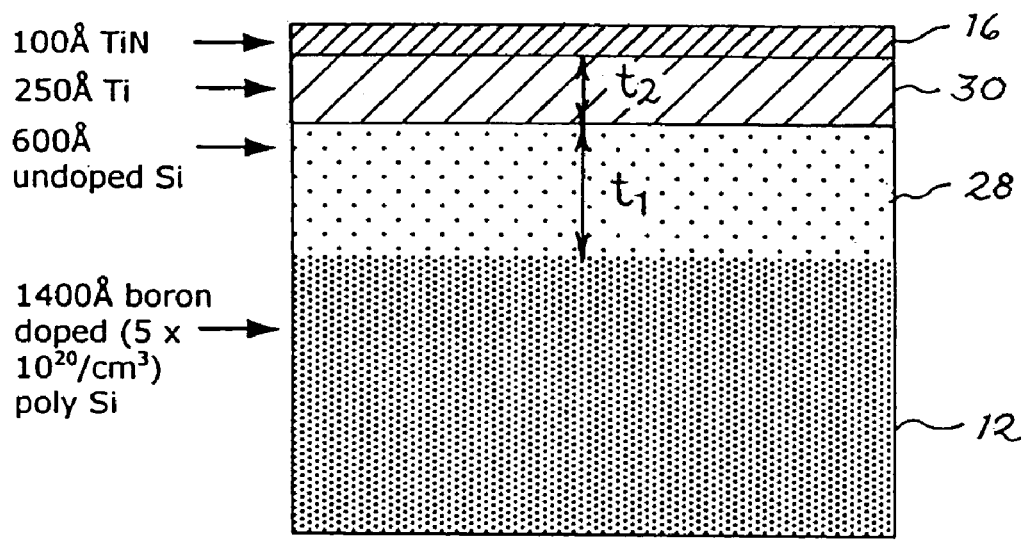
FIG. 3 is a cross-sectional view of a portion of the semiconductor structure of FIG. 1 at an intermediate stage of fabrication.
Figure 4:
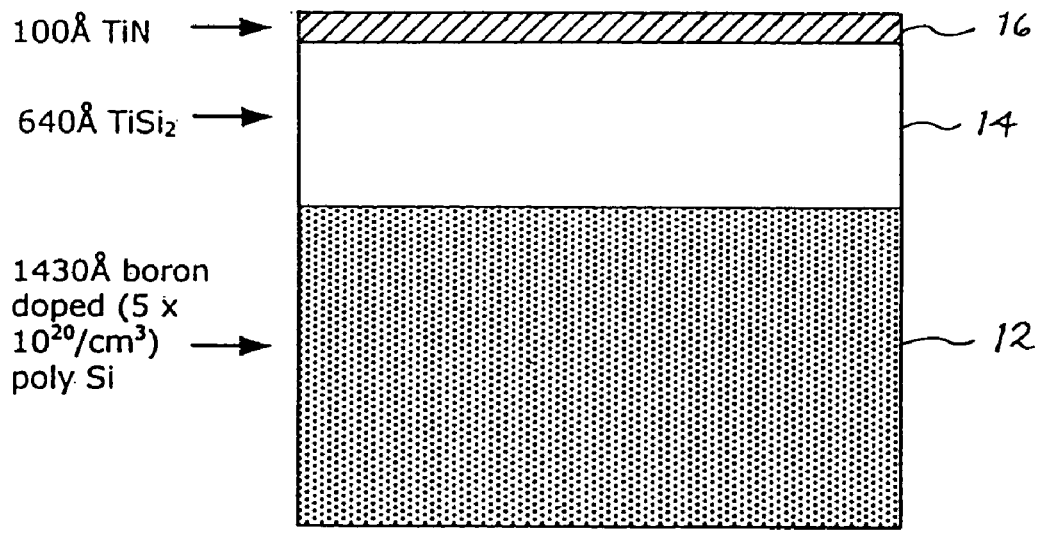
FIG. 4 is a cross-sectional view of the layers of FIG. 3 at a subsequent stage of semiconductor fabrication.

As described above, a capping layer similar to the layer 28 of FIG. 3 was formed between the titanium layer 30 and the underlying heavily doped semiconductor region. The capping layers 28 were deposited by in situ doped Low Pressure Chemical Vapor Deposition (LPCVD). The dopants of the underlying heavily doped semiconductor regions were incorporated by flowing $PH_3$ gas for phosphorus (n type doping), or $BCl_3$ gas for boron (p type doping). Doping concentration can be controlled by controlling the ratio of $SiH_4$ to either dopant source gas. In situ doping of silicon allows fine control of the doping concentration profile, as opposed to the more commonly used method of ion implantation.

As explained above, the undoped capping layer 28 is consumed in the subsequent reaction to form $TiSi_2$. Boron has a lower solid solubility in $TiSi_2$ than silicon at the anneal temperature of 800° C. Boron also has a much lower diffusivity in silicon than in $TiSi_2$ at the same temperature. These two facts combine to cause boron to agglomerate as $TiB_2$ precipitates in the $TiSi_2$.[5] V. Probst, H. Schaber, P. Lippens, L. Van den Hove, and R. Keersmaecker, Appl. Phys. Lett. 52, 1803 (1988). Without intending to be bound by any theory, the presence of $TiB_2$ precipitates are speculated to inhibit the C49 to C54 transformation, and thus are the reason why $TiSi_2$ formed on heavily boron doped Si has a higher resistivity than $TiSi_2$ formed on undoped Si.

Figure 5:
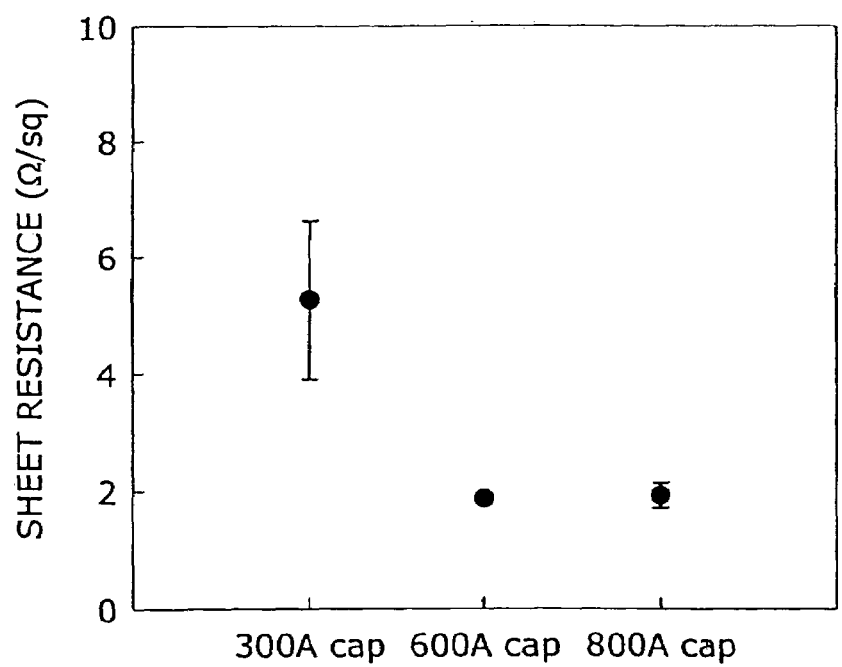
FIG. 5 is a graph illustrating variations in sheet resistance of narrow line conductors as a function of the thickness of the layer 28 of FIG. 3.

FIG. 5 shows the results of a series of measurements of sheet resistance for titanium disilicide wires of 0.25 μm width in semiconductor structures of the type described above, which differed in the thickness of the capping layer 28. In all cases, the basic structure of the semiconductor structure was as shown in FIG. 3, except that the thickness of the capping layer 28 was set at 300, 600 and 800 Angstroms for respective tests. The plotted data points are each an average of 14 measurements with the standard deviation shown as the error bar. Note that when the capping layer 28 was only 300 Å thick, the measured sheet resistance was about 5 ohms per square. However, the measured sheet resistance of the semiconductor structure with capping layers of 600 and 800 Angstroms showed a sheet resistance indicative of full conversion of titanium disilicide to C54 phase, and a measured sheet resistance of about 2 ohms per square.

Measurement of current and voltage across a layer stack consisting of $TiSi_2/Si/TiSi_2$ shows ohmic contact and not rectifying behavior when the upper $TiSi_2$ layer is formed as described above and the Si layer is heavily doped. This indicates that there is not a significant amount of undoped Si remaining underneath the upper $TiSi_2$ layer when the thickness of the capping layer is no greater than 2.2t2, where t2=thickness of the deposited titanium layer.

As used herein, two layers are said to be in "ohmic contact" when the curve of voltage versus current across the two layers is substantially linear over the range ±5V, i.e., the maximum deviation of the slope of the voltage versus current curve from the average slope of the curve over the range ±5V is ±10% of the average slope.

From the experimental results described above, an amorphous Si capping layer that has a thickness t1 greater than 1.2t2, where t2 is the thickness of the deposited Ti film, is effective to avoid the fine line effect. There is probably a maximum amount of boron that can be incorporated in the $TiSi_2$ before it begins to inhibit the transformation, thus the range of thicknesses quoted. Since the amount of Si consumed by Ti during the $TiSi_2$ reaction is well known,[1] this technique can used with any thickness Ti and Si films.

The tests summarized in FIG. 5 have confirmed that the methods described above can be used to form a set of titanium silicide conductors directly overlying a semiconductor region characterized by a boron dopant concentration greater than $1\times10^{20}/cm^3$, where each conductor is characterized by a width no greater than /0.3 μm, and where at least 90% of the conductors are characterized by a sheet resistance less 3 ohms/square.

The capping layer 28 provides the further advantage that the dopant concentration in the heavily doped semiconductor region 12 can be optimized for electrical characteristics of the device in which it is included, while the thickness of the capping layer 28 can be optimized for formation of low-resistance silicides.

From the foregoing, it should be apparent that the fine line affect can be avoided in 0.25 μm $TiSi_2$ lines on heavily boron doped polysilicon by depositing a capping layer that has the same amount of undoped amorphous Si as will be consumed in the reaction between Ti and Si in the formation of $TiSi_2$. The silicon remaining underneath the $TiSi_2$ can be heavily boron doped without adversely affecting the formation of low resistivity $TiSi_2$ on the surface. The annealing conditions of 800° C./60s allow a small amount (<100 Å) of undoped Si to remain between the $TiSi_2$ and doped Si prior to the final annealing operation; it will become doped after the annealing operation due to boron diffusion. J. Lasky, J. Nakos, O. Cain, and P. Giess, *IEEE Trans. Electron. Devices* ED-38, 2629 (1991). Therefore, even greater robustness of the process is obtained for large scale manufacturing. The $TiSi_2$ film is in intimate contact with doped Si, allowing good device performance. These advantages are obtained without adding substantial complexity to the process.

The methods described above eliminate the need for full conversion to C54-phase while the films are in blanket form (i.e., prior to being patterned into thin wires having widths of less than 0.3 μm), allowing device fabrication with minimal high temperature annealing.

Alternative Structure/Steps

Though the examples described above have illustrated the formation of low-resistivity titanium disilicide on heavily boron doped polysilicon, the present invention is not so limited. The methods described above can readily be adapted to reduce or eliminate fine line effects on silicon films that have any type of dopant. For example, this invention can also be used with n-type heavily doped semiconductor regions, which may be doped with phosphorous, for example, as well as with arsenic doped semiconductor regions. The fine line effect has been observed on polysilicon doped with arsenic in addition to polysilicon doped with boron and phosphorus. See R. Beyers, D. Coulman, and P. Merchant, *J. Appl. Phys.* 61, 5110 (1987); J. -I. Shiozawa et al. *Extended Abstracts* 1992 *International Conference On Solid State Devices and Materials,* Tsukuba, 410, 1992; and reference 3 listed above. In general, the dopant may be p-type or n-type, and the semiconductor material may be varied widely to include Si, alloys of Si such as SiGe, and other semiconductors such as GaAs, InP, GaN, and the like.

The methods described above can also be used to reduce or eliminate the fine line effect on polysilicon films that have been ion implanted to dope the films. A thin undoped or lightly doped amorphous silicon film can be deposited on top of the ion-implanted polysilicon film prior to titanium deposition and reaction.

Also, the capping layer described above may be a less heavily doped layer rather than an undoped layer, as compared to the heavily doped semiconductor region on which the capping layer is formed. In general, the capping layer should have a dopant concentration less than about $1\times10^{19}/cm^3$.

When low pressure chemical vapor deposition is used to form the heavily doped semiconductor region, various source gases can be used. For example, $SiH_4$ and $BCl_3$ source gases for p-type doped silicon can be used to form polycrystalline films with dopant concentrations greater than $6\times10^{19}/cm^3$. Amorphous p-type silicon films with dopant concentrations in excess of $5\times10^{20}$ can be achieved with the use of $Si_2H_6$ and $B_2H_6$ source gases in an LPCVD furnace.

As another alternative, different temperature/time schedules can be used for the annealing processes, and the thickness of the capping layer 28 can be varied in accordance with the thickness of the overlying titanium layer.

Also, one or more intervening layers may be placed between a first layer that overlies a second layer. As used herein, a first layer is said to overlie a second layer, whether or not such intervening layers are present.

Though the foregoing examples have related to the formulation of conductors in a three-dimensional memory array, this invention is not so limited. The techniques described above can be used to provide narrow width, low-resistivity, titanium disilicide conductors in a wide range of integrated circuit applications.

Best Mode Details

Simply by way of example, the following specific process steps have been found suitable to implement one preferred embodiment of this invention. Of course, these process steps are intended only by way of illustration, and they in no way limit the scope of this invention. The following subsections discuss selected ones of the blocks 50–62 of FIG. 2.

Blocks 50–52

The heavily doped semiconductor region of block 50 can be formed by heating a silicon wafer in an LPCVD furnace to 550° C. at a pressure of 400 mTorr. A gas flow of 500 sccm $SiH_4$, 72 sccm of 1.5% $BCl_3$ diluted in He, and 700 sccm of He is passed through the furnace. 1400 Å of p+ polysilicon film is deposited in a deposit time of about 40 minutes. Then the flow of $BCl_3$ diluted in He and He is stopped and the flow of 500 sccm of $SiH_4$ is maintained to deposit 600 Å of undoped amorphous silicon (deposit time about 24 minutes). The wafers are then removed from the furnace. An SGV RVP9000 LPCVD furnace has been found suitable.

Block 54

The wafer is now placed in a low pressure sputter chamber with argon gas flow, and a 250 Å thick layer of titanium is sputtered onto the amorphous silicon layer. Then 100 Å of TiN is sputtered on top of the Ti layer in either the same chamber (by additionally introducing nitrogen into the chamber) or in another chamber in the same tool. It is preferred that the TiN layer overlying the titanium layer is formed without an air break in order to prevent the titanium layer from picking up oxygen or nitrogen, which interfere with the formation of titanium disilicide. The wafer is then removed from the sputter tool.

Block 56

The wafer is then placed in a rapid thermal annealing chamber. After purging the chamber with argon, the chamber temperature is ramped at atmosphere to 600° C. using a ramp rate of 90° C. per second. The wafer is then annealed for one minute at 600° C. in an argon atmosphere. This forms C49 phase titanium disilicide and other titanium silicide phases.

Block 60

The blanket films of the annealed wafer are then patterned using standard lithographic techniques (deposit photoresist; expose the photoresist with a masked pattern; develop the photoresist; remove undeveloped photoresist, leaving patterned photoresist on the wafer; etch lines by removing TiN/$TiSi_x$/polysilicon in the areas not protected by photoresist; strip photoresist, leaving lines of TiN/$TiSi_x$/polysilicon).

Block 62

Place the patterned and etched wafers in a rapid thermal annealing chamber. After purging the chamber with argon, ramp the chamber temperature at atmosphere to 800° C. using a ramp rate of 65° C. per second. The wafer is then annealed for one minute at 800° C. in an argon atmosphere. This forms the desired, low-resistivity, C54-phase titanium disilicide.

CONCLUSION

The foregoing detailed description has described only a few of the many forms that this invention can take. For this reason, this detailed description is intended only by way of illustration and not limitation. It is only the following claims, including all equivalents, that are intended to define the scope of this invention.

What is claimed is:

1. A method for forming a semiconductor structure, said method comprising:
    (a) forming a first semiconductor region characterized by a dopant concentration greater than $1\times10^{19}/cm^3$;
    (b) forming a second semiconductor region overlying the first semiconductor region, said second semiconductor region comprising silicon and characterized by a dopant concentration less than $1\times10^{19}/cm^3$ and a thickness t1;
    (c) forming a layer comprising titanium directly overlying the second semiconductor region, said layer characterized by a line width no greater than 0.3 μm and a thickness t2, wherein t1>1.2t2;
    t1/t2 being sufficiently small that, when the layer is reacted with the second semiconductor region to form titanium disilicide, the titanium disilicide is in ohmic contact with the first semiconductor region;
    t1/t2 being sufficiently large that, when the layer is reacted with the second semiconductor region to form titanium disilicide, the titanium disilicide anneals to a phase with a sheet resistance less than 3 ohms/square.

2. The method of claim 1 further comprising:
    (d) annealing the second semiconductor region and the layer at a temperature of at least 550° C. after (c), thereby forming $TiSi_x$ from the titanium of the layer and the silicon of the second semiconductor region.

3. The method of claim 2 further comprising:
    (e) re-annealing the second semiconductor region and the layer after (d) at a temperature of at least 750° C., thereby converting the $TiSi_x$ to C54 phase in ohmic contact with the first semiconductor region.

4. The method of claim 1 wherein the first semiconductor region is formed in (a) with a dopant concentration greater than $1\times10^{20}/cm^3$.

5. The method of claim 4 wherein the first semiconductor region formed in (a) is doped primarily with boron.

6. The method of claim 1 wherein the first semiconductor region formed in (a) is doped primarily with boron.

7. The method of claim 1 wherein the semiconductor structure comprises a 3-D memory array, wherein the 3-D memory array comprises a plurality of memory cells arranged in a plurality of layers stacked vertically above one another in a single chip.

8. The method of claim 1 wherein t1≧2.2t2.

9. The method of claim 1 wherein t1=2.3t2±0.1t2.

10. A method for forming a semiconductor structure, said method comprising:
    (a) forming a heavily doped first semiconductor region;
    (b) forming a second semiconductor region comprising silicon and overlying the first semiconductor region, said second semiconductor region less heavily doped than said first semiconductor region and characterized by a thickness t1;
    (c) forming a layer comprising titanium directly overlying the second semiconductor region, said layer characterized by a line width no greater than 0.3 μm and a thickness t2, wherein t1>1.2t2, wherein t1/t2 being sufficiently small that, when the layer is reacted with the second semiconductor region to form titanium disilicide, the titanium disilicide is in ohmic contact with the first semiconductor region, and wherein t1/t2 being sufficiently large that, when the layer is reacted with the second semiconductor region to form titanium disilicide, the titanium disilicide anneals to a phase with a sheet resistance less than 3 ohms/square; and (d) annealing the second conductor region and the layer after (c) at a temperature of at least 750° C., thereby forming a low-resistivity, C54-phase $TiSi_2$ film in ohmic contact with the first semiconductor region.

11. The method of claim 10 wherein the semiconductor structure comprises a 3-D memory array, wherein the 3-D memory array comprises a plurality of memory cells arranged in a plurality of layers stacked vertically above one another in a single chip.

12. The method of claim 10 wherein $t1 \geq 2.2t2$.

13. The method of claim 10 wherein $t1 = 2.3t2 \pm 0.1t2$.

* * * * *